(12) United States Patent
Shin et al.

(10) Patent No.: US 12,068,343 B2
(45) Date of Patent: Aug. 20, 2024

(54) IMAGE SENSING DEVICE

(71) Applicant: SK hynix Inc., Icheon-si (KR)

(72) Inventors: Jong Hwan Shin, Icheon-si (KR);
Seung Hoon Sa, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 785 days.

(21) Appl. No.: 17/183,120

(22) Filed: Feb. 23, 2021

(65) Prior Publication Data
US 2022/0005856 A1   Jan. 6, 2022

(30) Foreign Application Priority Data

Jul. 2, 2020   (KR) .................. 10-2020-0081559

(51) Int. Cl.
*H01L 27/146*   (2006.01)
*H04N 25/75*    (2023.01)

(52) U.S. Cl.
CPC .... *H01L 27/14614* (2013.01); *H01L 27/1463* (2013.01); *H04N 25/75* (2023.01)

(58) Field of Classification Search
CPC ........... H01L 27/14614; H01L 27/1463; H01L 27/14605; H01L 27/14609; H01L 27/14607; H01L 27/1461; H04N 25/75
See application file for complete search history.

(56) References Cited

U.S. PATENT DOCUMENTS

| | | | | |
|---|---|---|---|---|
| 2005/0067640 A1* | 3/2005 | Ohkawa | ............ | H01L 27/14632 |
| | | | | 257/E27.131 |
| 2013/0320407 A1* | 12/2013 | Ahn | ........................ | H01L 31/02 |
| | | | | 257/239 |
| 2014/0217474 A1* | 8/2014 | Lee | ................... | H01L 27/14609 |
| | | | | 257/225 |
| 2014/0362272 A1* | 12/2014 | Ahn | ..................... | H01L 27/1464 |
| | | | | 348/308 |
| 2018/0102392 A1* | 4/2018 | Hwang | ............... | H01L 27/1461 |
| 2018/0190699 A1* | 7/2018 | Lee | ......................... | H04N 25/75 |
| 2021/0005647 A1* | 1/2021 | Kwag | .............. | H01L 27/14643 |
| 2021/0118925 A1* | 4/2021 | Zang | ................ | H01L 27/14605 |

FOREIGN PATENT DOCUMENTS

| KR | 10-1989567 B | 6/2019 |
|---|---|---|
| KR | 20210004595 A | 1/2021 |

OTHER PUBLICATIONS

Mamoru Terauchi 2007 Jpn. J. Appl. Phys. 46 7303 (Year: 2007).*

* cited by examiner

*Primary Examiner* — Calvin Y Choi
*Assistant Examiner* — Sarah L Ell
(74) *Attorney, Agent, or Firm* — Perkins Coie LLP

(57) ABSTRACT

An image sensing device is provided to include a plurality of unit pixel regions arranged in a first direction and a second direction, a first device isolation region structured to isolate the plurality of unit pixel regions from each other, a plurality of photoelectric conversion regions in the substrate to form a plurality of imaging pixels structured to generate photocharges, a plurality of second device isolation regions configured to define active regions of the plurality of imaging pixels, a plurality of floating diffusion regions formed in a first active region to store the photocharges, and a plurality of transfer gates structured to transmit the photocharges. The floating diffusion region is located contiguous to the transfer gate in the first direction and the second direction and is structured to surround a plurality of side surfaces of a corresponding transfer gate.

20 Claims, 11 Drawing Sheets

IMAGE SENSING DEVICE

CROSS-REFERENCE TO RELATED APPLICATION

This patent document claims the priority and benefits of Korean patent application No. 10-2020-0081559, filed on Jul. 2, 2020, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert light of optical images into electrical signals for displaying the captured images and for further processing of the captured images. With the recent development of various industries and sectors, including computer, automotive, medical and communication industries generates various demands for highly integrated, high-performance image sensors in various devices and systems such as digital cameras, camcorders, personal communication systems (PCSs), video game consoles, surveillance cameras, medical micro-cameras, robots, etc.

SUMMARY

The embodiments of the disclosed technology relate to an image sensing device for improving transmission efficiency of a transfer transistor.

In one aspect, an image sensing device is provided to include a pixel array in which unit pixels configured to generate a pixel signal corresponding to incident light by performing photoelectric conversion of the incident light are arranged in a first direction and a second direction perpendicular to the first direction, wherein the pixel array includes: a substrate isolated per unit pixel by a first device isolation region; a photoelectric conversion region formed in a lower portion of the substrate within each unit pixel, and configured to generate photocharges by performing photoelectric conversion of incident light; a second device isolation region formed in an upper portion of the substrate within each unit pixel, and configured to define a first active region and a second active region; a floating diffusion (FD) region formed in the first active region, and configured to store photocharges; and a transfer gate configured to transmit photocharges generated by the photoelectric conversion region to the floating diffusion (FD) region, wherein the floating diffusion (FD) region is located contiguous or adjacent to the transfer gate in the first direction and the second direction so as to surround a plurality of side surfaces of the transfer gate.

In another aspect, an image sensing device is provided to include a plurality of unit pixel regions arranged in a first direction and a second direction perpendicular to the first direction in a substrate, a first device isolation region supported by the substrate and structured to isolate the plurality of unit pixel regions from each other, a plurality of photoelectric conversion regions supported by the substrate and formed in the plurality of unit pixel regions in the substrate to form a plurality of imaging pixels structured to generate photocharges by performing photoelectric conversion of incident light, a plurality of second device isolation regions supported by the substrate to define active regions of the plurality of imaging pixels, a plurality of floating diffusion regions formed in a first active region to store the photocharges generated by the photoelectric conversion region, and a plurality of transfer gates structured to transmit the photocharges generated by the photoelectric conversion region to the floating diffusion region. The each of the floating diffusion regions may be located contiguous to the transfer gate in the first direction and the second direction and be structured to surround a plurality of side surfaces of a corresponding transfer gate.

In another aspect, an image sensing device is provided to include a plurality of unit pixels configured to generate an electrical signal corresponding to incident light by performing conversion of the incident light, and a first device isolation region structured to isolate the plurality of unit pixels from each other and surrounding each of the unit pixels. Each of the unit pixels may include a photoelectric conversion region structured to generate photocharges by converting the incident light, a floating diffusion region structured to store the photocharges generated by the photoelectric conversion region, and a transfer gate configured to transmit the photocharges generated by the photoelectric conversion region to the floating diffusion region. A portion of the transfer gate may be inserted into the floating diffusion region, a portion of the floating diffusion region formed to overlap with the transfer gate in a second direction perpendicular to the first direction may be located at both sides of the transfer gate in the second direction.

In another aspect, an image sensing device is provided to include a unit pixel configured to generate an electrical signal corresponding to incident light by performing conversion of the incident light; and a device isolation region configured to surround the unit pixel, wherein the device isolation region includes: a first isolation region formed to have a first width, and elongated in a first direction; and a second isolation region formed to have a second width smaller than the first width, and elongated in the first direction so as to be consecutively coupled to the first isolation region, wherein a floating diffusion (FD) region in which photocharges generated by conversion of the incident light are temporarily stored is located in a region that is formed to protrude toward the second isolation region within the unit pixel.

In another aspect, an image sensing device is provided to include a unit pixel configured to generate an electrical signal corresponding to incident light by performing conversion of the incident light, and a device isolation region structured to surround the unit pixel to isolate the unit pixel from other unit pixels. The device isolation region may include a first isolation region formed to have a first width, and elongated in a first direction, and a second isolation region formed to have a second width smaller than the first width, and elongated in the first direction and coupled to the first isolation region. The unit pixel includes a floating diffusion region structured to protrude toward the second isolation region to store photocharges generated by conversion of the incident light.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device that can improve transmission efficiency fora transfer transistor in the image sensing device.

Figure 1:
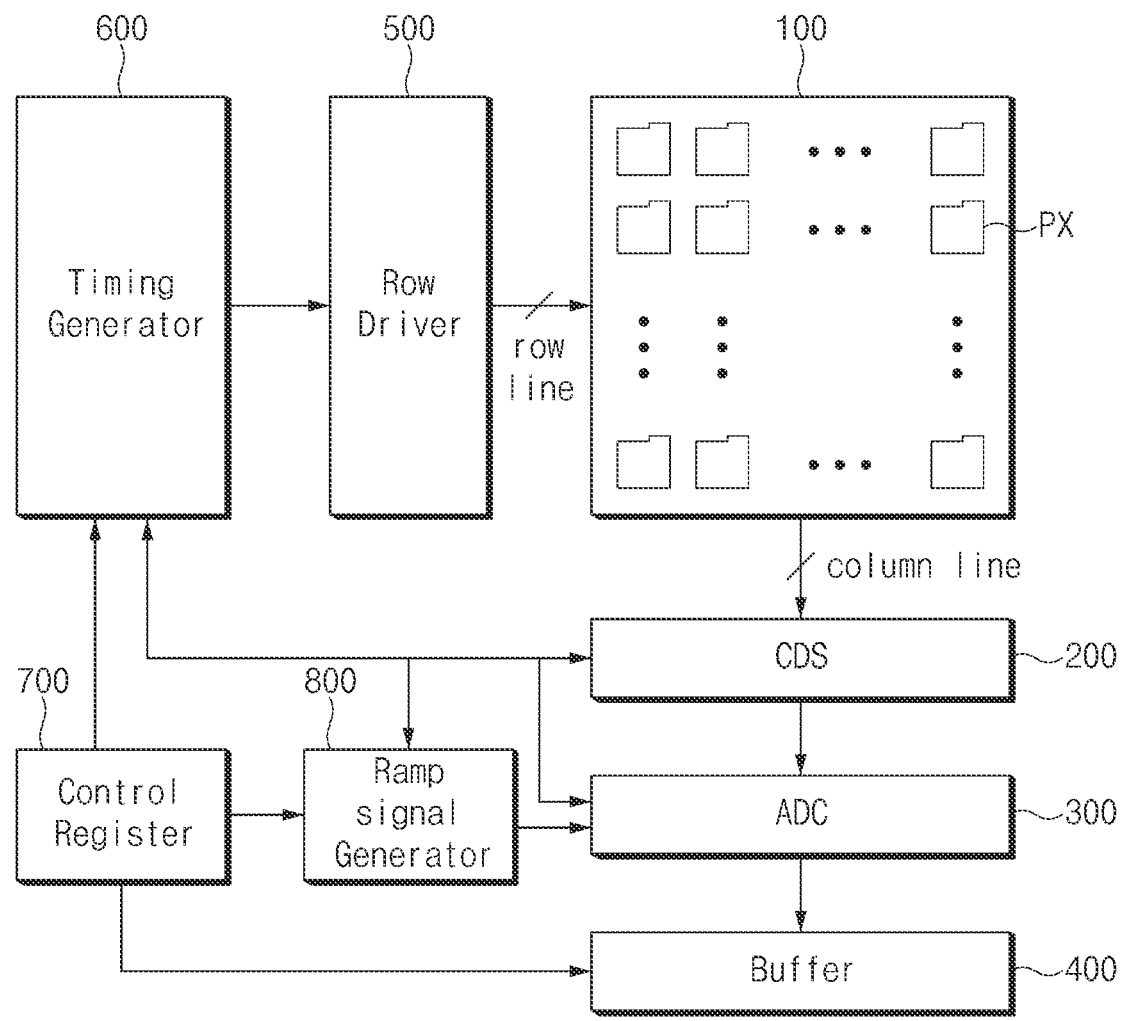
FIG. 1 is a block diagram illustrating an example of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) consecutively arranged in a two-dimensional (2D) array in which the unit pixels PXs are arranged in rows and columns. Each unit pixel PX may generate a pixel signal corresponding to incident light by converting light into an electrical current. In some implementations, each unit pixel (PX) may output the pixel signal to the correlated double sampler (CDS) 200 through column lines to remove an undesired offset. Each unit pixel PX may include a photoelectric conversion region, a floating diffusion region, an electrical contact tap region, and a plurality of pixel transistors. The photoelectric conversion region (e.g., p-n junction) is structured to create photocharges (e.g., photon-generated electrons) based on photons of the incident light. The floating diffusion region is structured to temporarily store photocharges generated by the photoelectric conversion region. The tap region is an electrical contact that is structured to apply a bias voltage to a well region of the corresponding unit pixel, and the plurality of pixel transistors is structured to activate the corresponding unit pixel. In some implementations, the plurality of pixel transistors may include a transfer transistor configured to transfer the photocharges from photoelectric conversion region to the floating diffusion region. Each unit pixel PX may be physically isolated from adjacent unit pixels by a device isolation region. Each unit pixel PX includes active regions in which the floating diffusion region, transistors, and the electrical contact tap region are formed. The active regions may be physically isolated from each other by a junction isolation structure. Here, the junction isolation structure may include an impurity region. In some implementations, a gate of the transfer transistor and the floating diffusion region are structured to be in contact with each other at more than one lateral wall. In an example, the floating diffusion region is formed in a first active region in contact with three sides (or lateral walls) of a gate of the transfer transistor as will be discussed with reference to FIG. 2 below. A gate insulation layer may be formed between the gate of the transfer transistor and the floating diffusion region. For convenience of description, the gate based on some implementations of the disclosed technology may be defined to include the gate insulation layer.

As discussed above, each unit pixel PX may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. The correlated double sampler (CDS) 200 may sample and hold voltages corresponding to pixel signals received from the unit pixels of the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may convert an analog signal received from the correlated double sampler (CDS) 200 into a digital signal in response to a clock signal received from the timing generator 600 and a ramp signal received from the ramp signal generator 800. In some implementations, the analog-to-digital converter (ADC) circuit 300 may be a ramp-compare type analog-to-digital converter that compares the analog pixel signal with a reference signal such as the ramp signal that ramps up or down, and a timer counts the clock signal until a voltage of the ramp signal matches the analog pixel signal.

The buffer 400 may temporarily hold or latch each of the digital signals received from the analog-to-digital converter (ADC) 300, may sense or detect and amplify each of the digital signals, and may output each of the amplified digital signals.

The row driver 500 may be used to activate or drive interconnect lines in the pixel array 100 in response to an output signal of the timing generator 600.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Figure 2:
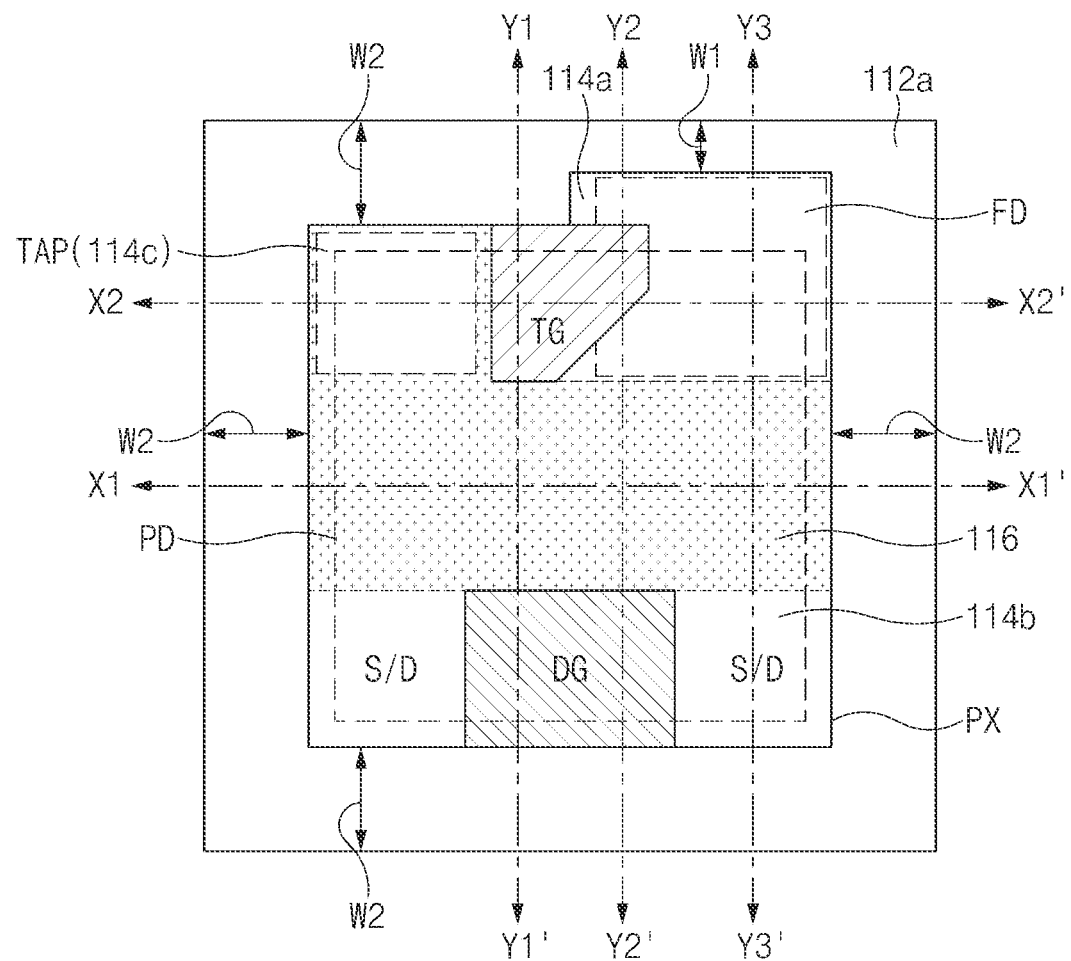
FIG. 2 is a schematic diagram illustrating an example of a structure of any one of unit pixels shown in FIG. 1 based on some implementations of the disclosed technology.

FIG. 2 is a schematic diagram illustrating an example of a structure of any one of the unit pixels PXs shown in FIG. 1 based on some implementations of the disclosed technology.

Referring to FIG. 2, each of the unit pixels PXs may be physically isolated from adjacent unit pixels by a device isolation region 112a. For example, each of the unit pixels does not physically share a photoelectric conversion region PD, a floating diffusion region FD, or pixel transistors with adjacent unit pixels. Thus, each unit pixel includes its own photoelectric conversion region PD, floating diffusion region FD, or transistor surrounded by the device isolation structure, and each of the photoelectric conversion region PD, the floating diffusion region FD, or the transistor formed in a unit pixel cannot extend to another unit pixel. In some implementations, the device isolation region 112a may include an isolation structure formed by filling a trench with an insulation material. The trench is formed by etching a portion of a substrate to a predetermined depth. For example, the isolation structure may include a deep trench isolation (DTI) structure or a stack of the deep trench isolation (DTI) structure and a shallow trench isolation (STI) structure. Specifically, in a plane view, the device isolation region 112a may be formed to surround the unit pixels PXs. In forming the device isolation region 112a, the width of the device isolation region 112a is not uniform in each unit pixel and the width W1 of some regions of the device isolation region 112a is less than the width W2 of other regions of the device isolation region 112a. For example, in the device isolation region 112a, the width W1 of a first region that is contiguous or adjacent in a second direction to the active region 114a in which the floating diffusion region FD is formed may be less than the width W2 of other regions. In this case, each of the widths W1 and W2 may denote the length of the device isolation region 112a formed between the contiguous or adjacent unit pixels PXs.

Each unit pixel PX may be formed in a substrate and isolated by the device isolation region 112a, and may include a single photoelectric conversion region PD, a single floating diffusion region FD, and two pixel transistors. The two pixel transistors may include a transfer transistor and a drive transistor.

The transfer transistor may be used to transfer photocharges generated by the photoelectric conversion region PD to the floating diffusion region FD in response to a transmission signal. In some implementations, the photoelectric conversion region PD and the floating diffusion region FD correspond to source/drain regions of the transfer transistor. A transfer gate TG, which is the gate of a transfer transistor, is formed in the active region 114a. Example structures of the transfer gate TG may include a recess gate in which at least some regions are buried in the substrate to form a channel in a vertical direction.

The drive transistor may include a drive gate DG and source/drain regions S/D disposed at both sides of the drive gate DG. The drive transistor may be any one of a reset transistor configured to initialize the floating diffusion regions FD in response to a reset signal, a source follower transistor configured to generate a pixel signal corresponding to the voltage level of the photocharges stored in the floating diffusion region FD, and a selection transistor configured to output a pixel signal generated by the source follower transistor to column lines in response to a selection signal. For example, the floating diffusion regions FD of adjacent unit pixels in the pixel array 100 may be coupled to each other through conductive lines, forming a common floating diffusion node. In one example, the drive transistors of the corresponding unit pixels may be coupled to each other through conductive lines. In another example, the drive transistors of the corresponding unit pixels may be coupled to the common floating diffusion node. As such, each of the drive transistors may operate as any one of the reset transistor, the source follower transistor, and the selection transistor. The drive transistor may be formed in the active region 114b.

In each unit pixel PX, the floating diffusion region FD, the transfer transistor, the drive transistor, and the electrical contact tap region TAP are formed in the active regions 114a, 114b, and 114c, which may be defined by a device isolation region 116. In one example, the device isolation region 116 may include an impurity region. In an example, the device isolation region 116 is formed by filing a trench in a substrate as discussed above. In another example, the device isolation region 116 may include a junction isolation structure that is formed by implanting impurities into the substrate.

The floating diffusion region FD may be formed in any one corner of the unit pixel PX. The transfer gate TG may be formed contiguous or adjacent to the floating diffusion region FD in a first direction. The electrical contact tap region TAP may be formed contiguous or adjacent to the transfer gate TG in the first direction. For example, the electrical contact tap region TAP and the floating diffusion region FD may be respectively disposed at both sides of the transfer gate TG in the first direction.

The drive transistor may be formed contiguous or adjacent to the floating diffusion region FD, the electrical contact tap region TAP, and the transfer gate TG in a second direction perpendicular to the first direction. For example, the drive transistor may be arranged contiguous or adjacent to the floating diffusion region FD, the electrical contact tap region TAP, and the transfer gate TG in the second direction on the basis of the device isolation region 116 interposed therebetween.

In some implementations, the floating diffusion region FD formed in the active region 114a may extend to the device isolation region 112a, so that the floating diffusion region FD may be formed contiguous or adjacent to side or lateral surfaces of the transfer gate TG in the first direction and the second direction. In some implementations, the floating diffusion region FD and the transfer gate TG are disposed in contact at two or more side or lateral surfaces. Thus, the contact area between the floating diffusion region FD and the transfer gate TG increases. In some implementations, unit pixels are arranged such that least one side of the transfer gate TG is in contact with the device isolation region 112a, the width of a portion of a specific region contacting the transfer gate TG from among the device isolation region 112a is reduced, and instead the active region 114a may be extended, so that the floating diffusion region FD can also be formed in the extended region. In this way, the transfer gate TG is surrounded by the floating diffusion region FD from three sides, so that the transfer gate TG has more transfer paths for transferring photocharges or has a more efficient transfer path, improving the transmission efficiency of the transfer transistor.

Figure 3A:
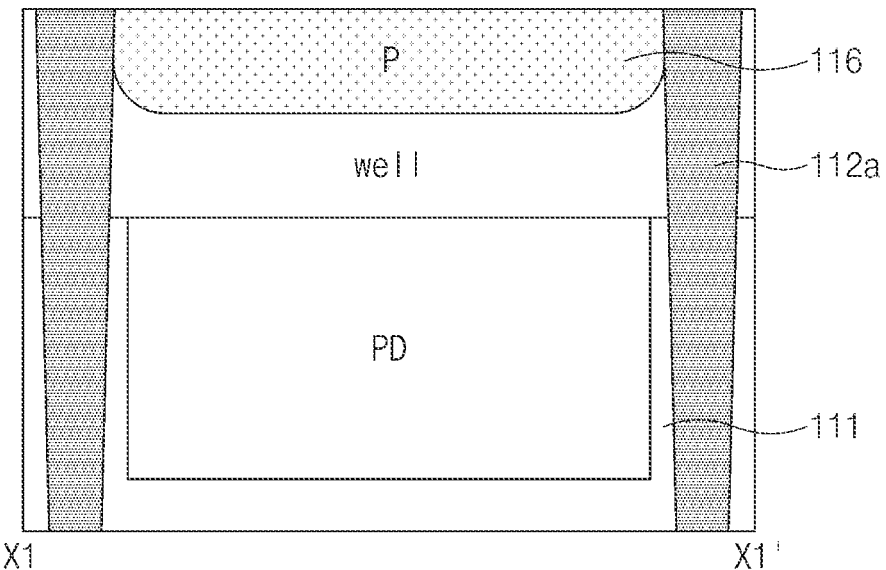
FIG. 3A is a cross-sectional view illustrating an example of a unit pixel taken along the line X1-X1' shown in FIG. 2 based on some implementations of the disclosed technology.
Figure 3B:
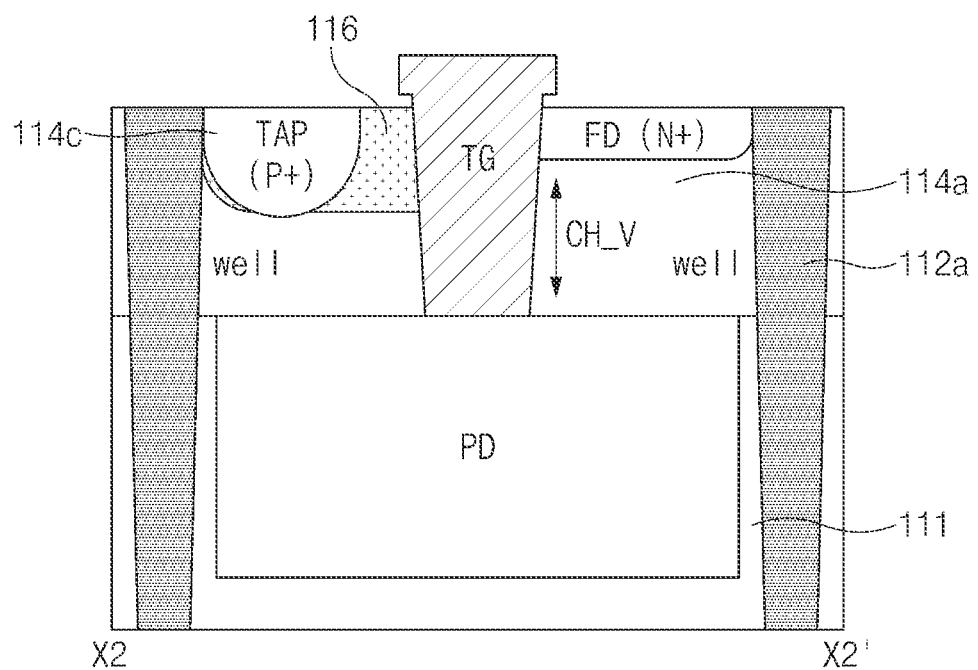
FIG. 3B is a cross-sectional view illustrating an example of the unit pixel taken along the line X2-X2' shown in FIG. 2 based on some implementations of the disclosed technology.
Figure 4A:
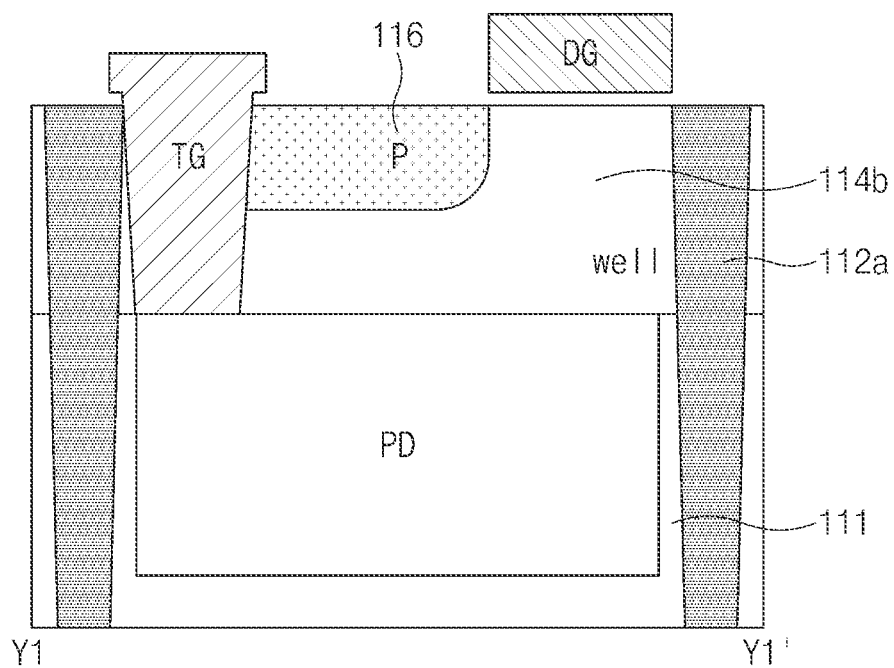
FIG. 4A is a cross-sectional view illustrating an example of the unit pixel taken along the line Y1-Y1' shown in FIG. 2 based on some implementations of the disclosed technology.
Figure 4B:
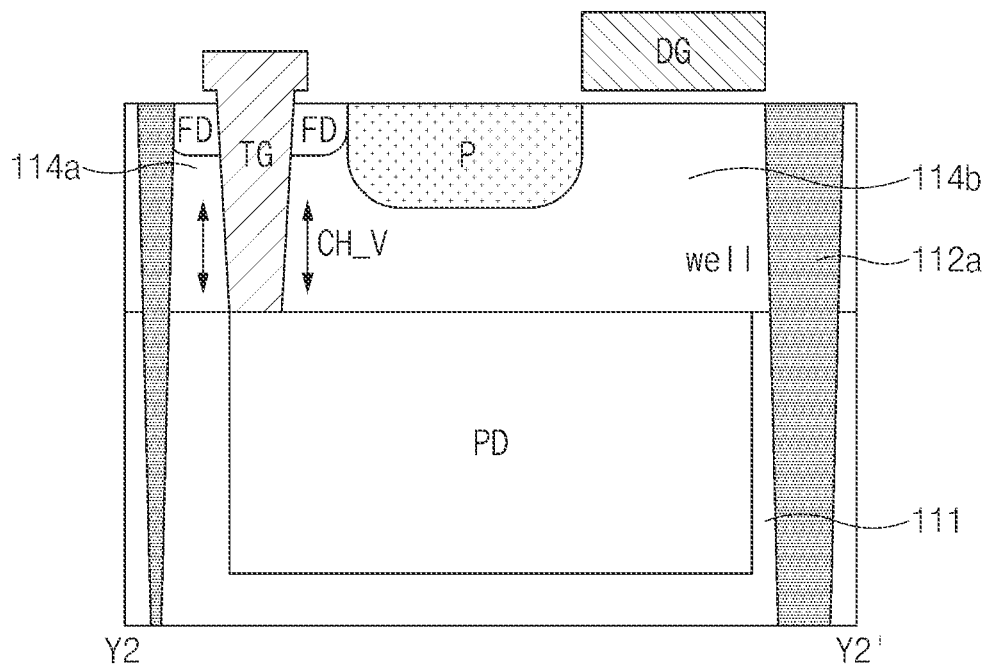
FIG. 4B is a cross-sectional view illustrating an example of the unit pixel taken along the line Y2-Y2' shown in FIG. 2 based on some implementations of the disclosed technology.
Figure 4C:
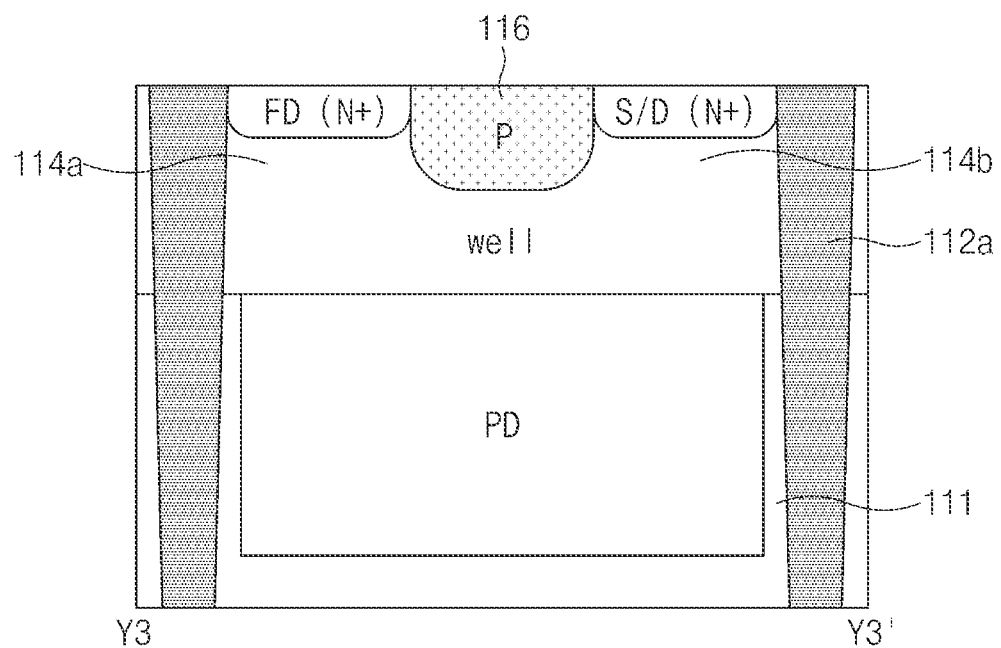
FIG. 4C is a cross-sectional view illustrating an example of the unit pixel taken along the line Y3-Y3' shown in FIG. 2 based on some implementations of the disclosed technology.

FIG. 3A is a cross-sectional view illustrating an example of the unit pixel taken along the line X1-X1' shown in FIG. 2. FIG. 3B is a cross-sectional view illustrating an example of the unit pixel taken along the line X2-X2' shown in FIG. 2. FIG. 4A is a cross-sectional view illustrating an example of the unit pixel taken along the line Y1-Y1' shown in FIG. 2. FIG. 4B is a cross-sectional view illustrating an example of the unit pixel taken along the line Y2-Y2' shown in FIG. 2. FIG. 4C is a cross-sectional view illustrating an example of the unit pixel taken along the line Y3-Y3' shown in FIG. 2.

Referring to FIGS. 3A, 3B, 4A, 4B, and 4C, a substrate 111 may include a first surface and a second surface facing away or opposite to the first surface. The substrate 111 may be divided into a plurality of isolated region by the device isolation region 112a to form a plurality of unit pixels PX in the plurality of isolated region, respectively. For example, each unit pixel PX may be physically isolated from contiguous or adjacent unit pixels by the device isolation region 112a. The device isolation region 112a may include a deep trench isolation (DTI) structure, and may be formed to penetrate the substrate 111.

The photoelectric conversion region PD may generate photocharges by converting incident light. The photoelectric conversion region PD may be formed in a lower portion of the substrate 111 in the unit pixel PX. In some implementations, in order to increase light reception efficiency, the photoelectric conversion region PD may be formed to occupy as large area in the lower region of the substrate 111 as possible. For example, the photoelectric conversion region PD may be formed in a lower region of the substrate 111 in a manner that the photoelectric conversion region PD is formed to vertically overlap with the floating diffusion region FD, the electrical contact tap region TAP, the transfer transistor, the drive transistor, and the device isolation region 116. The photoelectric conversion region PD may include an N-type impurity region.

The electrical contact tap region TAP may be used to apply a bias voltage to a well region of the substrate 111. The electrical contact tap region TAP may include a P-type impurity region in the same manner as in the well region, and the P-type impurity region may be formed through implantation of high-density P-type (P+) impurities.

In each unit pixel PX, the active regions 114a, 114b, and 114c in which the photoelectric conversion region PD, the electrical contact tap region TAP, the transfer transistor, and the drive transistor are formed may be defined by the device isolation region 116. The device isolation region 116 may include a P-type impurity region that is formed by implanting P-type impurities into an upper portion of the substrate 111. For example, the device isolation region 116 may include an impurity region. Here, the impurity region may be in contact with a top surface of the substrate 111, and may be formed by implanting impurities to a predetermined depth from the top surface of the substrate 111. That is, the device isolation region 116 may not be a trench-shaped device isolation structure that is formed by etching the substrate 111, and may include a junction isolation structure that is formed by implanting impurities into the upper portion of the substrate 111.

In some implementations, the photoelectric conversion region PD and the floating diffusion region FD correspond to source/drain regions of the transfer transistor. The transfer transistor may include a transfer gate TG that outputs photocharges generated by the photoelectric conversion region PD to the floating diffusion region FD in response to a transmission signal. Example structures of the transfer gate TG may include a recess gate that vertically connects the photoelectric conversion region PD to the floating diffusion region FD through a vertical channel CH_V. A gate insulation layer (not shown) may be formed between the transfer gate TG and the floating diffusion region FD. For convenience of description, the transfer gate TG based on some implementations of the disclosed technology may be defined to include the gate insulation layer.

In some implementations where the unit pixels are isolated from each other, the photoelectric conversion region PD is formed in a lower portion of the substrate 111 and photocharges of the photoelectric conversion region PD are transferred to the floating diffusion region FD using the recessed transfer gate TG. Here, there is a possibility for the trench structure to a dark current and a hot pixel if a trench structure is present in the substrate 111.

Therefore, in some implementations of the disclosed technology, instead of the isolation structure formed in a trench of the substrate 111, a junction isolation structure 116 is used to isolate various active regions in the unit pixel PX from each other. In one example, the junction isolation structure 116 is formed by implanting impurities into the substrate 111. In this way, the dark current and the number of hot pixels can be minimized.

Moreover, the active region 114a in which the floating diffusion region FD is formed is formed to protrude toward the device isolation region 112a, and the floating diffusion region FD may be formed to extend to the protruded region, such that the floating diffusion region FD may be formed to surround at least three sides of the transfer gate TG as shown in FIGS. 3B and 4B. For example, the floating diffusion region FD may be formed to surround more than one side of the upper portion of a specific region buried in the substrate 111 from among the transfer gate TG.

As described above, the active region 114a in which the floating diffusion region FD is formed and the transfer gate TG may have a broader contact area therebetween, and a vertical channel CH_V region through which the photoelectric conversion region PD is coupled to the floating diffusion region FD may be extended, improving the transmission efficiency of the transfer transistor. Moreover, since the active region 114a is extended, the vertical channel CH_V and other additional transfer paths may be formed, further improving the transmission efficiency.

Figure 5A:
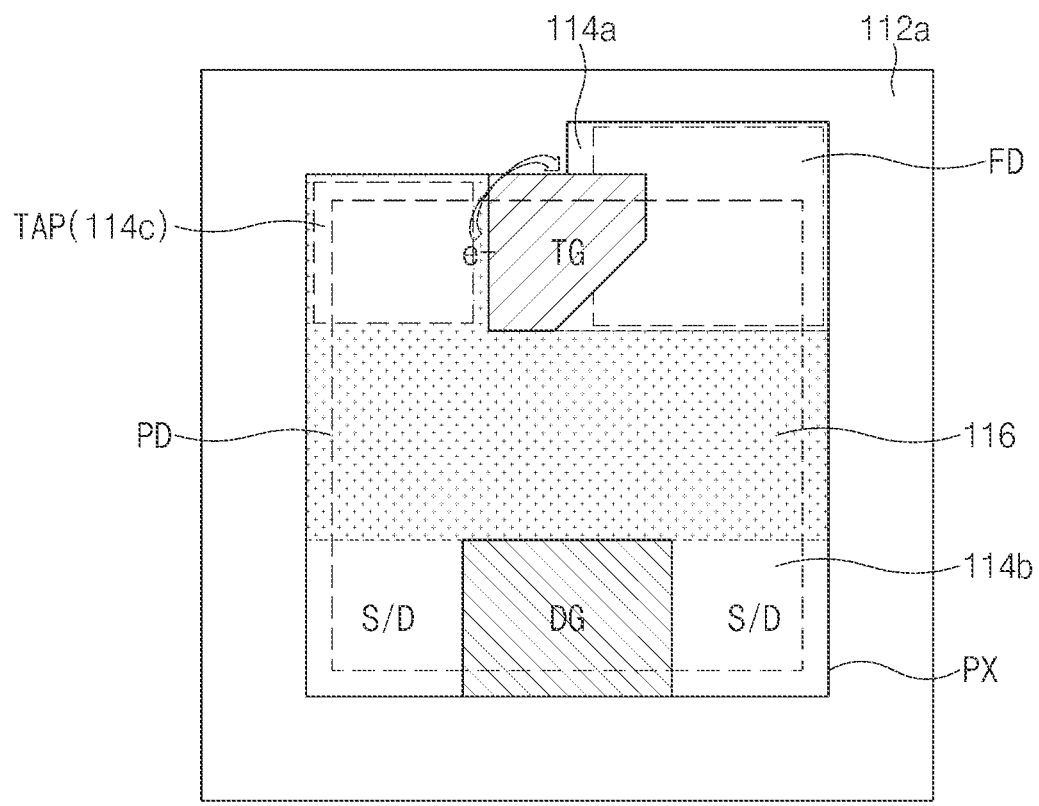
FIGS. 5A and 5B are schematic diagrams illustrating examples of newly-created transfer paths denoted by arrows shown in FIGS. 2 and 3B based on some implementations of the disclosed technology.
Figure 5B:
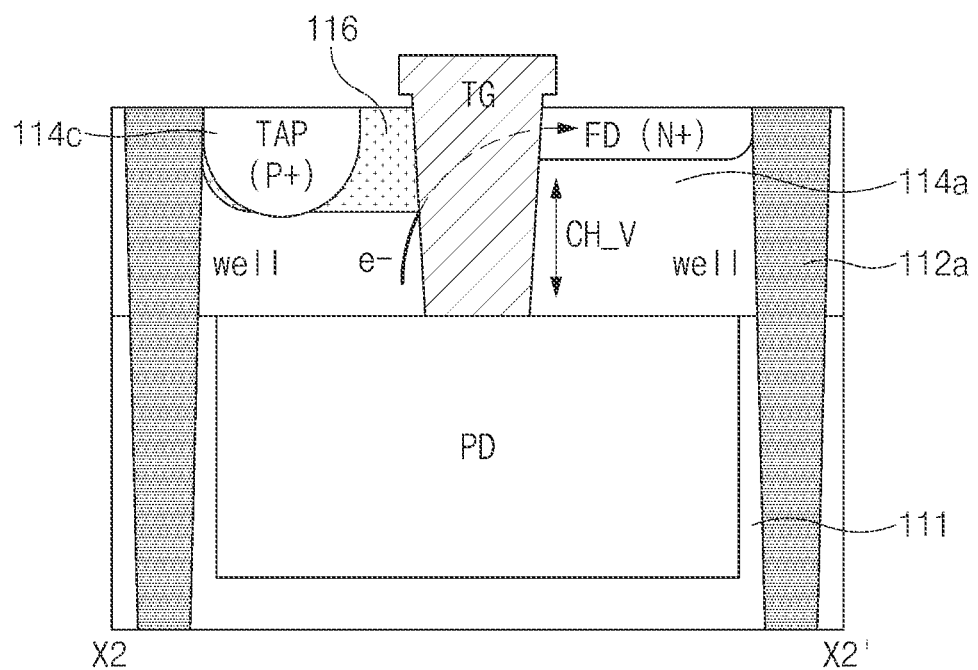

FIGS. 5A and 5B are schematic diagrams illustrating examples of newly-created transfer paths denoted by arrows shown in FIGS. 2 and 3B based on some implementations of the disclosed technology.

For example, in a specific structure in which at least one side of the transfer gate TG is formed to contact the device isolation region 112a, and the electrical contact tap region TAP, the transfer gate TG, and the floating diffusion region FD are arranged in a line, it may be difficult for photocharges located opposite to the floating diffusion region FD around the transfer gate TG to be transferred to the floating diffusion region FD. However, the active region 114a may be extended and the floating diffusion region FD may be formed in the extended active region 114a, thereby reducing the distance between the floating diffusion region FD and the opposite region of the floating diffusion region FD. Therefore, photocharges in the opposite region can be more easily transferred to the floating diffusion region FD through the extended active region 114a. As a result, transmission efficiency of the transfer transistor can be further improved.

Figure 6:
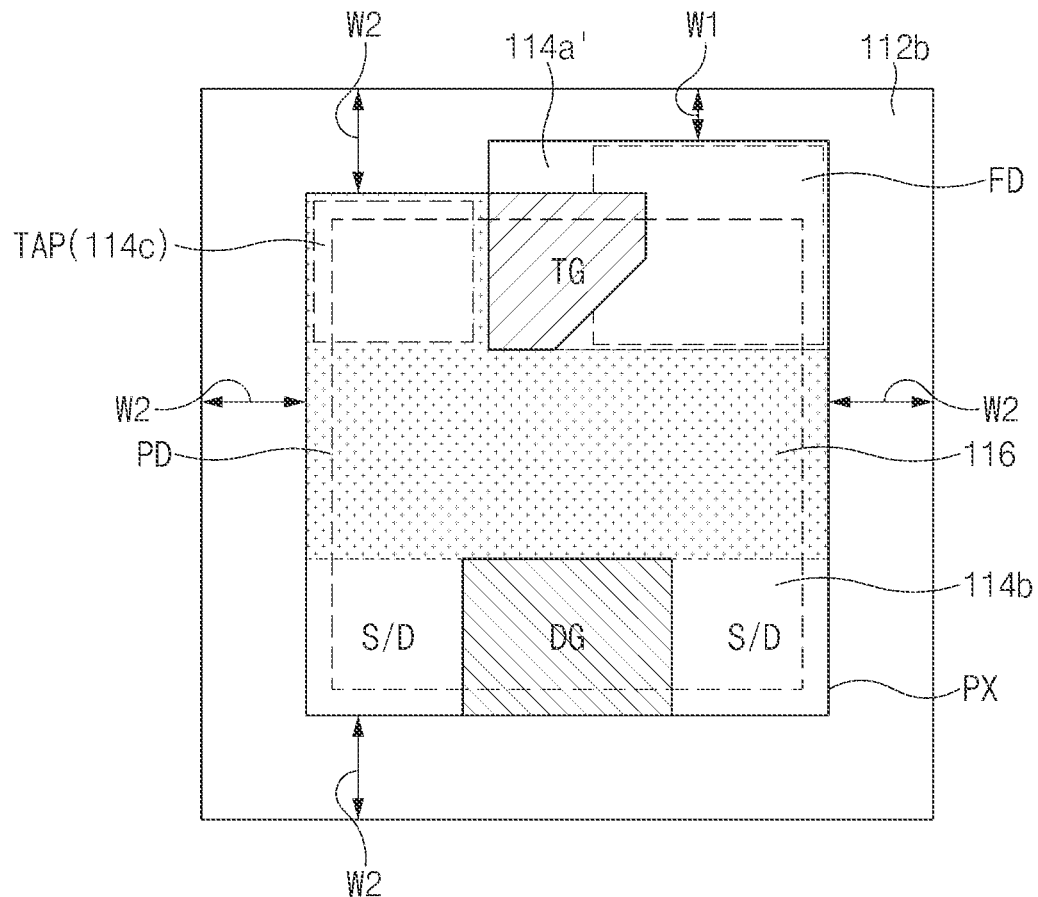
FIG. 6 is a schematic diagram illustrating an example of a structure of a unit pixel based on some other implementations of the disclosed technology.

FIG. 6 is a schematic diagram illustrating an example of a structure of a unit pixel based on some other implementations of the disclosed technology.

Referring to FIG. 6, the active region 114a' may be extended in a manner that the transfer gate TG is not in contact with the device isolation region 112b. For example, the active region 114a' may be further elongated in the first direction in a manner that the transfer gate TG is not in contact with the device isolation region 112b. In this case, photocharges stored in the opposite region of the floating diffusion region FD around the transfer gate TG can be more easily transferred to the floating diffusion region FD.

Figure 7:
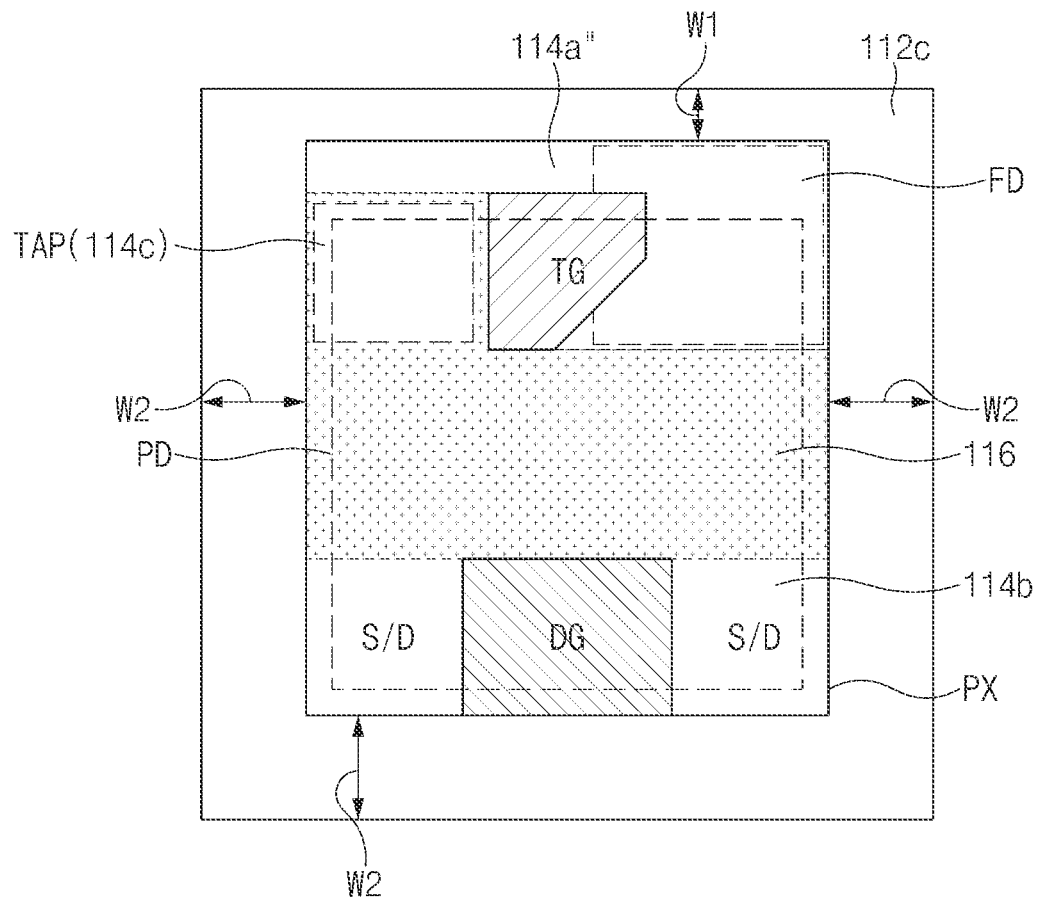
FIG. 7 is a schematic diagram illustrating an example of a structure of a unit pixel based on some other implementations of the disclosed technology.

FIG. 7 is a schematic diagram illustrating an example of a structure of a unit pixel based on some other implementations of the disclosed technology.

Referring to FIG. 7, the active region 114a" may be elongated to the electrical contact tap region TAP. For example, the active region 114a" may be elongated to occupy one surface of the unit pixel PX in the first direction. In this case, the active regions 114a" and 114c may be isolated from each other by the device isolation region 116.

If the device isolation region 112c is formed as described above, the transmission efficiency of photocharges can be greatly improved, and a fabrication process for forming the device isolation region 112c can be simplified.

As is apparent from the above description, the image sensing device based on some implementations of the disclosed technology can improve the transmission efficiency of the transfer transistor.

Only a few examples for implementing the disclosed technology are disclosed. Additional implementations can be made based on what is disclosed in this patent document.

What is claimed is:

1. An image sensing device comprising:
a plurality of unit pixel regions arranged in a first direction and a second direction perpendicular to the first direction in a substrate;
a first device isolation region supported by the substrate and structured to isolate the plurality of unit pixel regions from each other;
a plurality of photoelectric conversion regions supported by the substrate and formed in the plurality of unit pixel regions in the substrate to form a plurality of imaging pixels structured to generate photocharges by performing photoelectric conversion of incident light;
a plurality of second device isolation regions supported by the substrate to define active regions of the plurality of imaging pixels;
a plurality of floating diffusion regions formed in a first active region to store the photocharges generated by the photoelectric conversion regions; and
a plurality of transfer gates structured to transmit the photocharges generated by the photoelectric conversion regions to the plurality of the floating diffusion region,
wherein each of the floating diffusion regions is located contiguous to only one of two sides of a corresponding transfer gate in the first direction and contiguous to two sides of the corresponding transfer gate in the second direction.

2. The image sensing device according to claim 1, wherein each of the plurality of floating diffusion regions includes:
a first region disposed between a transfer gate and the first device isolation region and contiguous to the transfer gate in the second direction.

3. The image sensing device according to claim 2, wherein each of the plurality of the floating diffusion regions includes:
a second region disposed between the transfer gate and a second device isolation region and contiguous to the transfer gate in the second direction.

4. The image sensing device according to claim 2, wherein:
the first region is in contact with a portion of one side surface from among side surfaces of the transfer gate.

5. The image sensing device according to claim 1, wherein the active regions of the plurality of imaging pixels include:
a second active region located contiguous to the transfer gate in the first direction and in an opposite direction to where a floating diffusion region is located.

6. The image sensing device according to claim 5, further comprising:
an electrical contact region formed in the second active region, and configured to receive a voltage and apply the received voltage as a bias voltage to the substrate.

7. The image sensing device according to claim 1, wherein the first device isolation region includes:
an isolation structure formed in a trench in the substrate.

8. The image sensing device according to claim 7, wherein:
the first device isolation region is formed to penetrate the substrate.

9. The image sensing device according to claim 1, wherein the first device isolation region includes:
a first isolation region arranged contiguous to a floating diffusion region, and elongated in the first direction;
a second isolation region coupled to one end of the first isolation region, and elongated in the second direction;
a third isolation region coupled to the other end of the first isolation region, and arranged in the second direction in parallel to the second isolation region; and
a fourth isolation region including two ends coupled to the second isolation region and the third isolation region, respectively,
wherein the first isolation region includes a first region disposed contiguous to the floating diffusion region and a second region disposed contiguous to the transfer gate, and
wherein a width of the first region is less than a width of the second region.

10. The image sensing device according to claim 1, wherein a second device isolation region includes:
an impurity region including impurities implanted to a predetermined depth from a top surface of the substrate.

11. The image sensing device according to claim 10, wherein:
the second device isolation region is an impurity region formed by implanting P-type impurities without including a trench.

12. The image sensing device according to claim 1, wherein a portion of the transfer gate is buried in the substrate.

13. An image sensing device comprising:
a plurality of unit pixels configured to generate an electrical signal corresponding to incident light by performing conversion of the incident light; and
a first device isolation region structured to isolate the plurality of unit pixels from each other and surrounding each of the unit pixels,
wherein each of the unit pixels includes:
a photoelectric conversion region structured to generate photocharges by converting the incident light;

a floating diffusion region structured to store the photocharges generated by the photoelectric conversion region; and a transfer gate configured to transmit the photocharges generated by the photoelectric conversion region to the floating diffusion region, wherein a portion of the transfer gate is inserted into the floating diffusion region; and wherein the portion of the floating diffusion region is contiguous to only one of two side surfaces of the transfer gate in a first direction and contiguous to two sides of the transfer gate in a second direction perpendicular to the first direction.

14. The image sensing device according to claim 13, wherein:
the first device isolation region includes an isolation structure formed in a trench in a substrate that includes the plurality of unit pixels.

15. The image sensing device according to claim 13, wherein the first device isolation region includes:
a first isolation region arranged contiguous to the floating diffusion region, and elongated in the first direction;
a second isolation region coupled to one end of the first isolation region, and elongated in the second direction;
a third isolation region coupled to the other end of the first isolation region, and arranged in the second direction while being contiguous to the floating diffusion region; and
a fourth isolation region including two ends coupled to the second isolation region and the third isolation region, respectively,
wherein a portion contacting the floating diffusion region from among the first isolation region is formed to have a smaller width than each of the second to fourth isolation regions.

16. The image sensing device according to claim 15, wherein:
the floating diffusion region includes a portion that is disposed between the transfer gate and the first isolation region and contiguous to the transfer gate.

17. The image sensing device according to claim 15, wherein each of the unit pixels further includes:
an electrical contact region located opposite to the floating diffusion region based on the transfer gate while being contiguous to the first isolation region.

18. The image sensing device according to claim 13, wherein each of the unit pixels is formed in a substrate and isolated by the first device isolation region, and wherein the substrate includes a second device isolation region formed in an upper portion of the substrate to define active regions.

19. The image sensing device according to claim 18, wherein the second device isolation region includes:
an impurity region including impurities implanted to a predetermined depth from a top surface of the substrate.

20. An image sensing device comprising:
a unit pixel configured to generate an electrical signal corresponding to incident light by performing conversion of the incident light; and
a device isolation region structured to surround the unit pixel to isolate the unit pixel from other unit pixels,
wherein the unit pixel includes;
a floating diffusion region structured to store photocharges generated by conversion of the incident light; and
a transfer gate structured to transmit the photocharges to the floating diffusion region,
wherein the device isolation region includes:
a first isolation region formed to have a first width, and elongated in a first direction and disposed contiguous to the transfer gate; and
a second isolation region formed to have a second width smaller than the first width and coupled to the first isolation region, and elongated in the first direction and disposed contiguous to the floating diffusion region.

* * * * *